US012677700B2

(12) United States Patent
Mayer et al.

(10) Patent No.: US 12,677,700 B2
(45) Date of Patent: Jul. 7, 2026

(54) ELECTRONIC DEVICE FOR CAPTURING OR EMITTING A PHYSICAL QUANTITY AND MANUFACTURING METHOD

(71) Applicant: ALEDIA, Échirolles (FR)

(72) Inventors: Frédéric Mayer, Voiron (FR); Frédéric Mercier, Saint Nicolas de Macherin (FR); Erwan Dornel, Champagnier (FR); Ivan-Christophe Robin, Grenoble (FR)

(73) Assignee: ALEDIA, Echirolles (FR)

( * ) Notice: Subject to any disclaimer, the term of this patent is extended or adjusted under 35 U.S.C. 154(b) by 777 days.

(21) Appl. No.: 18/008,048

(22) PCT Filed: May 31, 2021

(86) PCT No.: PCT/FR2021/050977

§ 371 (c)(1),
(2) Date: Dec. 2, 2022

(87) PCT Pub. No.: WO2021/245343

PCT Pub. Date: Dec. 9, 2021

(65) Prior Publication Data

US 2024/0297155 A1      Sep. 5, 2024

(30) Foreign Application Priority Data

Jun. 3, 2020      (FR) ...................................... 2005799

(51) Int. Cl.
H10W 90/00          (2026.01)
H10H 20/852          (2025.01)
(Continued)

(52) U.S. Cl.
CPC .......... H10W 90/00 (2026.01); H10H 20/852 (2025.01); H10H 20/857 (2025.01); *H10H 20/0362* (2025.01); *H10H 20/0364* (2025.01)

(58) Field of Classification Search
CPC ... H01L 25/0753; H01L 25/167; H01L 24/97; H01L 2924/12041; H10F 55/10;
(Continued)

(56) References Cited

U.S. PATENT DOCUMENTS 10,121,772 B1 * 11/2018 Wu ........................ H10W 90/00
10,490,536 B2 * 11/2019 Wu ........................ H10W 90/00
(Continued)

FOREIGN PATENT DOCUMENTS

WO          2014140796 A1      9/2014
WO          2016108021 A1      7/2016
WO          2020002815 A1      1/2020

OTHER PUBLICATIONS

International Search Report and Written Opinion; Issued Sep. 29, 2021; International Application No. PCT/FR2021/050977, Filed: May 31, 2021; 12 pages.

*Primary Examiner* — Victor A Mandala
(74) *Attorney, Agent, or Firm* — CANTOR COLBURN LLP

(57) ABSTRACT

An electronic device for capturing or emitting a physical quantity includes a lower support; lower conductive elements; active elements including an active part and each including a lower portion electrically connected to at least one of the lower conductive elements and an upper portion; and upper conductive elements. The upper portion of each active element is electrically connected to one of the upper conductive elements. At least one first electrically insulating element is arranged between the lateral wall of at least two adjacent active elements disposed side by side on the support surface of the lower support. The first electrically insulating element is arranged between one of the upper conductive elements and one of the lower conductive elements.

24 Claims, 7 Drawing Sheets

(51) Int. Cl.
*H10H 20/857* (2025.01)
*H10H 20/01* (2025.01)

(58) Field of Classification Search
CPC ............. H10H 20/018; H10H 20/8506; H10H 20/8512; H10H 20/8514; H10H 20/854; H10H 20/852; H10H 20/857; H10H 20/0362; H10H 20/0364; H10W 90/00; H10W 72/0198
See application file for complete search history.

(56) References Cited

U.S. PATENT DOCUMENTS

| | | | |
|---|---|---|---|
| 2016/0315068 A1* | 10/2016 | Lee | H10W 90/00 |
| 2017/0117257 A1* | 4/2017 | Lee | H10W 90/00 |
| 2018/0190672 A1* | 7/2018 | Lee | H10D 86/60 |
| 2019/0115333 A1* | 4/2019 | Wu | H10W 90/00 |
| 2019/0319066 A1* | 10/2019 | Tan | H10H 20/8514 |
| 2020/0212267 A1* | 7/2020 | Kwak | H10H 20/819 |
| 2020/0373473 A1* | 11/2020 | Wi | H10H 20/857 |
| 2022/0004304 A1* | 1/2022 | Yang | G06F 3/0412 |
| 2022/0029058 A1* | 1/2022 | Kim | H10H 20/8312 |
| 2022/0352277 A1* | 11/2022 | Kim | H10K 59/122 |
| 2023/0127225 A1* | 4/2023 | Kim | H10W 90/00 257/91 |
| 2023/0138887 A1* | 5/2023 | Yang | H10H 20/01 257/79 |
| 2023/0216004 A1* | 7/2023 | Song | H10H 20/84 257/91 |
| 2023/0352643 A1* | 11/2023 | Cho | H10H 20/857 |

* cited by examiner

ELECTRONIC DEVICE FOR CAPTURING OR EMITTING A PHYSICAL QUANTITY AND MANUFACTURING METHOD

CROSS REFERENCE TO RELATED APPLICATIONS

This application is a National Stage of PCT Application No. PCT/FR2021/050977 filed on May 31, 2021, which claims priority to French Patent Application No. FR2005799, filed on Jun. 3, 2020, the contents of each of which are incorporated herein by reference thereto.

TECHNICAL FIELD

The present disclosure concerns an electronic device for capturing or emitting a physical quantity.

The disclosure also concerns a method for manufacturing an electronic device for capturing or emitting a physical quantity.

BACKGROUND

In the field of light display screens, the light elements constituting the screen must be arranged in a matrix manner. The accuracy required for the formation of such a matrix increases as the resolution expected for screens increases.

It is known to produce the light-emitting diodes which constitute the light emission elements on a first support, for example a silicon or sapphire wafer, and to transfer them on a second support intended to be an integral part of the screen. The electrical connections that allow electrically powering the light-emitting diodes thus transferred are made at the level of the second support.

In the case where the light-emitting diodes are three-dimensional wired diodes, the electrical connection of the upper part of the light-emitting diodes and the electrical connection of their lower part remain difficult to achieve without risk of involuntary short-circuit, due to the distance which separates them which may be only a few tens of micrometers.

The thermocompression method is often used to create an electrical connection between the light elements and the second support. Nonetheless, such a solution has performance that can be improved because it involves the use of a high temperature incompatible with the light conversion elements which can cover the light-emitting diodes of the light elements.

In the field of imaging by high-resolution sensors, the sensors and emitters of parameters or physical quantities must be arranged in a matrix manner. The accuracy required for the formation of such a matrix increases as the resolution expected for the screens increases and the same issues raised above are highlighted. In addition, the high topography of the concerned sensors or emitters makes their integration over large surfaces more complex.

SUMMARY

The present disclosure aims to provide an electronic device and a manufacturing method making it possible to address all or part of the problems presented above.

In particular, an aim is to provide a solution that meets at least one of the following advantages:

to allow providing of an electronic device for capturing or emitting a physical quantity limiting the risks of short-circuit;

to allow providing of an electronic device for capturing or emitting a physical quantity at a lower cost;

to limit the risks of damaging light conversion elements;

to allow providing of an electronic device for capturing or emitting a physical quantity having large dimensions;

to allow providing of an electronic device for capturing or emitting a physical quantity with high performance.

This aim can be achieved thanks to an electronic device for capturing or emitting a physical quantity comprising:

a lower support;

lower conductive elements electrically insulated from each other and formed at least in part on a support surface of the lower support;

a plurality of active elements having a thickness considered in a transverse direction oriented transversely to the lower support and each including a lower portion electrically connected to at least one of the lower conductive elements and an upper portion disposed on the side opposite to the lower support relative to the lower portion in the transverse direction, each active element including an active part capable of changing state when an external parameter external to said active part is applied to said active part;

upper conductive elements electrically insulated from each other;

the upper portion of each active element is electrically connected to at least one of the upper conductive elements and each active element delimits externally, along the thickness, at least one lateral wall which extends laterally around the active element; at least one first electrically insulating element is arranged between at least a part of said at least one lateral wall of at least two adjacent active elements disposed side by side on the support surface of the lower support so as to electrically insulate the lateral walls from each other, which are separated by the first electrically insulating element; the first electrically insulating element is arranged between at least one of the upper conductive elements and at least one of the lower conductive elements so that said at least one upper conductive element and said at least one lower conductive element separated by the first electrically insulating element are electrically insulated from each other.

Some preferred but non-limiting aspects of this electronic device are as follows.

In one implementation of the device, at least one of the active elements includes a control device capable of influencing at least one parameter associated with the active part of said active element.

In one implementation of the device, the active part of at least one of the active elements includes a light emission part capable of emitting at least one light radiation when the external parameter applied to the active part is an electrical quantity resulting from at least one among the upper conductive elements and the lower conductive elements.

In one implementation of the device, the control device is capable of modulating at least one emission parameter relating to the light radiation that can be emitted by the light emission part.

In one implementation of the device, the control device comprises at least one transistor.

In one implementation of the device, at least one of the upper conductive elements is formed, on the one hand, by a transparent electrical conductor in electrical contact with the light emission part of the active element and having properties of transparency vis-à-vis the light radiation that can be emitted by the emission part and, on the other hand, by a metal electrical conductor in electrical contact with the transparent electrical conductor.

In one implementation of the device, the metal electrical conductor of the upper conductive elements is arranged so as not to cover, at least in the transverse direction, the emission part of the active elements.

In one implementation of the device, the light emission part of at least one of the active elements includes at least one light-emitting diode.

In one implementation of the device, said light-emitting diode is wire-shaped having micrometric dimensions and whose main axis of extension is overall parallel to the transverse direction.

In one implementation of the device, at least two of the light-emitting diodes of the light emission part of at least one of the active elements are capable of emitting at least two light radiations having different wavelengths.

In one implementation of the device, at least one of the light-emitting diodes of the light emission part of at least one of the active elements is surrounded at least in part by photoluminescent materials capable of transforming the light radiation emitted by the corresponding light-emitting diode.

In one implementation of the device, the active part of at least one of the active elements comprises a device for measuring said external parameter configured to change state when said external parameter is applied to said active part.

In one implementation of the device, the control device determines the change of state of the measuring device of the active part and delivers an output signal representative of this determination between at least one of the upper conductive elements and one of the lower conductive elements.

In one implementation of the device, at least one of the measuring devices is an electrical component selected from a sensor and a transducer.

In one implementation of the device, the active elements are obtained on an external support distinct from the lower support prior to a transfer of said active elements towards said lower support.

In one implementation of the device, the first electrically insulating element comprises a set of metal particles coated in an electrically insulating material adapted so that the first electrically insulating element is capable of varying between a first state of electrical insulation in which the first electrically insulating element does not undergo collapsing pressure and where a majority of the metal particles do not touch each other and a second state of anisotropic electrical conductivity in which a majority of the metal particles are in electrical contact under the effect of a collapsing pressure applied in the transverse direction.

In one implementation of the device, the first electrically insulating element is arranged in a contact portion arranged between the lower portion of at least one of the active elements and at least one of the lower conductive elements connected with the lower portion of this active element; the lower portion of the active element being brought into electrical contact with the lower conductive element by the passage of the first electrically insulating element from its first state of electrical insulation to its second state of directional electrical conductivity by the application of the collapsing pressure on the contact portion by the active element and/or the lower support, in particular resulting from the action of an electrical bonding device on at least one element taken from the group comprising the active element and the lower support, so that all or part of the metal particles of the first electrically insulating element, located in the contact portion, provide the electrical connection between the lower portion of the active element and the lower conductive element.

In one implementation of the device, a second electrically insulating element, distinct from the first electrically insulating element, is arranged between at least two adjacent active elements disposed side by side on the support surface of the lower support and between the upper conductive elements and the lower conductive elements so as to electrically insulate from each other the members of at least one of the following two groups:

a first group consisting of the adjacent active elements separated from each other by the second electrically insulating element;

a second group consisting of the upper conductive elements and the lower conductive elements separated from each other by the second electrically insulating element.

In one implementation of the device, the metal electrical conductor of at least one of the upper conductive elements is arranged between the second electrically insulating element and the transparent electrical conductor.

In one implementation of the device, at least one of the upper conductive elements delimits a local portion arranged at the level of the upper portion of the active element to which it is connected, said local portion of the upper electrical element being formed at least in part by adaptive lithography.

In one implementation of the device, the external parameter is comprised in the group formed by a sound wave, a light radiation, an electromagnetic radiation, an electric current, a potential difference and a pressure wave.

The disclosure also relates to the implementation of a method for manufacturing an electronic device for capturing or emitting a physical quantity, the method comprising the following steps:

E1) provide a lower support comprising lower conductive elements electrically insulated from each other and formed at least in part on a support surface of the lower support;

E2) provide a plurality of active elements having a thickness considered in a transverse direction oriented transversely to the lower support and each including a lower portion capable of being electrically connected to at least one of the lower conductive elements, an upper portion disposed on the side opposite to the lower support relative to the lower portion in the transverse direction and an active part capable of changing state when an external parameter external to said active part is applied to said active part, each active element provided in step E2) delimiting externally, along the thickness, at least one lateral wall which extends laterally around at least the lower portion and the upper portion;

E3) form at least one first electrically insulating element arranged between at least a part of said at least one lateral wall of at least two adjacent active elements disposed side by side on the support surface of the lower support so as to electrically insulate the lateral walls from each other, which are separated by the first electrically insulating element;

at the end of one of the steps E2) and E3), the lower portion of at least one of the active elements is electrically connected to at least one of the lower conductive elements;

E4) form upper conductive elements electrically insulated from each other so that the upper portion of each active element is electrically connected to at least one of the formed upper conductive elements; at the end of step E4), the first electrically insulating element is further arranged between at least one of the upper conductive elements and at least one of the lower conductive elements so that said at least one upper conductive element and said at least one lower conductive element separated by the first electrically insulating element are electrically insulated from each other.

Some preferred but non-limiting aspects of this manufacturing method are as follows.

In one implementation of the method, the active elements provided in step E2) are obtained on an external support different from the lower support prior to a transfer, implemented during step E2), of said active elements towards the lower support.

In one implementation of the method, the first electrically insulating element comprises a set of metal particles coated in an electrically insulating material adapted so that the first electrically insulating element is capable of varying between a first state of electrical insulation in which the first electrically insulating element does not undergo collapsing pressure and where a majority of the metal particles do not touch each other and a second state of directional electrical conductivity in which a majority of the metal particles are in electrical contact under the effect of a collapsing pressure, the step E3) comprising a sub-step E31) consisting in forming the first electrically insulating element in a contact portion arranged between the lower portion of at least one of the active elements and at least one of the lower conductive elements capable of being connected with the lower portion of this active element;

the method comprising a step E21) consisting in applying the collapsing pressure on the contact portion by a relative movement between the active element and the lower support, the relative movement resulting from the action of an electrical bonding device on at least one element taken from the group comprising the active element and the lower support, so that all or part of the metal particles of the first electrically insulating element, located in the contact portion, are in their second state of directional electrical conductivity providing the electrical connection between the lower portion of the active element and the lower conductive element.

BRIEF DESCRIPTION OF THE DRAWINGS

Other aspects, aims, advantages and features of the disclosure will better appear on reading the following detailed description of preferred embodiments thereof, given by way of non-limiting example, and made with reference to the accompanying drawings in which.

DETAILED DESCRIPTION OF THE DRAWINGS

Figure 1:
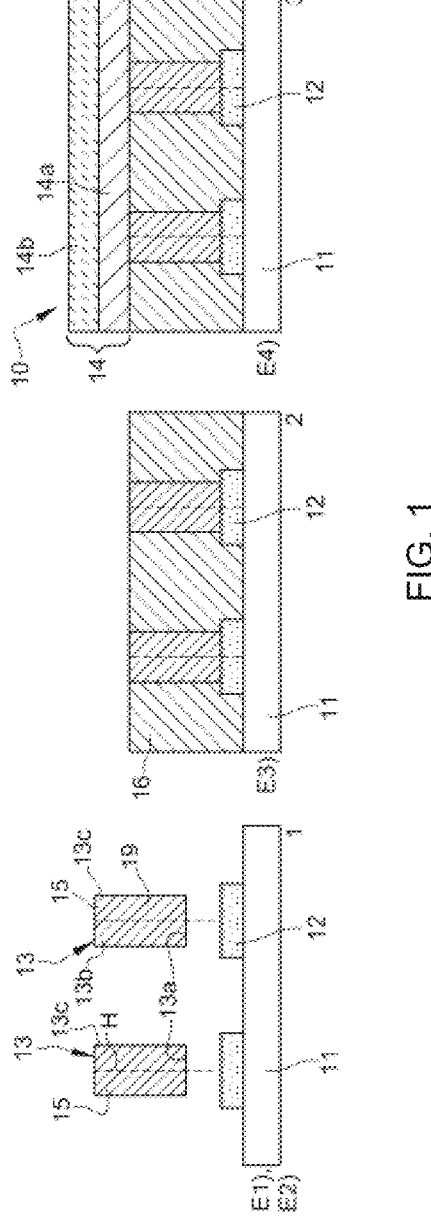
FIG. 1 is a schematic sectional view of several steps of a first example of a manufacturing method of a first embodiment of an electronic device according to the disclosure.

In the appended FIGS. 1 to 7 and in the following description, elements which are functionally identical or similar are identified by the same references. In addition, the different elements are not represented to scale so as to favor the clarity of the figures for ease of understanding. Furthermore, the different embodiments and variants are not mutually exclusive and may, on the contrary, be combined with each other.

In the following description, unless otherwise indicated, the terms "substantially", "approximately", "overall" and "in the range of" mean "within 10%".

As illustrated in FIGS. 1 to 6, the disclosure relates firstly to an electronic device 10 for light emission. However, this electronic device 10 can indifferently be adapted for capturing or emitting a physical quantity. The term "capturing" means similarly a "measurement". The physical quantity to be captured can be a pressure, a pressure wave, a sound wave, a humidity level, a temperature, an electromagnetic field, a visible or not light radiation, an electric current or even a potential difference. The physical quantity to be emitted can be of the same nature as that to be captured or measured or of a different nature.

The electronic device 10 firstly comprises a lower support 11. The lower support 11 is for example electrically insulating and formed by at least one glass plate. The lower support 11 can also be electrically conductive and formed by at least one metal plate. The lower support 11 can also comprise electrically conductive tracks insulated from each other and formed on the surface or inside the lower support 11. The lower support 11 can be formed in a crystalline or non-crystalline material and can also comprise active or passive components, like transistors or memories. The lower support 11 can, for example, constitute a support for a light display screen.

The electronic device 10 also comprises lower electrically conductive elements 12 electrically insulated from each other and formed at least in part on a support surface of the lower support 11. The lower conductive elements 12 can be formed by adaptive or not photolithography and/or by etching as well as by vacuum deposition methods or by wet process of metals such as for example copper, aluminum, silver, gold, titanium, palladium, nickel or alloys formed for example of these metals or multilayers with different layers of different metals selected, for example, from the above-mentioned metals.

The electronic device 10 further comprises a plurality of active elements 13 having a thickness H considered in a transverse direction oriented transversely to the lower support 11. The thickness H of the active elements can be comprised between 0.5 μm and 200 μm. For example, the active elements 13 are obtained on an external support distinct from the lower support 11 prior to a transfer of said active elements 13 towards the lower support 11. This is advantageous because very often the active elements 13 require specific forming conditions, such as high temperatures above 500° C. which could damage the lower support 11.

The active elements 13 include a lower portion 13*a* electrically connected to at least one of the lower conductive elements 12. The term "electrically connected" means "connected by direct physical contact" or else "connected by indirect contact via one or several conductive elements" such as for example an adhesive containing metal particles or carbon nanotubes or even a pressure or temperature sensitive adhesive.

The active elements 13 also comprise an upper portion 13*b* disposed on the side opposite to the lower support 11 relative to the lower portion 13*a* in the transverse direction. The lower portions 13*a* and the upper portions 13*b* can comprise one or several electrically conductive electrodes which promote contact with the lower conductive elements 12 and/or with upper electrically conductive elements 14 mentioned below. Thus, the upper portion 13*b* of each active element 13 is electrically connected to at least one of the upper conductive elements 14. In one example, the upper portion 13*b* of the active element 13 includes two electrodes, each being connected to a different upper conductive element 14.

Each active element 13 includes an active part capable of changing state when an external parameter external to the active part is applied to the active part. The external parameter is, for example, a pressure, a pressure wave, a sound wave, a humidity level, a temperature, an electromagnetic field, a visible or not light radiation, an electric current or a potential difference. Each active element 13 delimits externally, along the thickness H, at least one lateral wall 13*c* which extends laterally around the active element 13.

The electronic device 10 also comprises the upper electrically conductive elements 14, which are electrically insulated from each other. Each upper conductive element 14 is electrically connected to the upper portion 13*b* of at least one of the active elements 13. The term "electrically connected" means "connected by direct physical contact" or else "connected by indirect contact via one or several intermediate conductive elements".

The electronic device 10 further comprises a first electrically insulating element 16 which is arranged between at least a part of a lateral wall 13*c* of at least two adjacent active elements 13 disposed side by side on the support surface of the lower support 11. Thus, the first electrically insulating element 16 makes it possible to electrically insulate the lateral walls 13*c* from each other, which are separated by the first electrically insulating element 16. In an example illustrated in FIGS. 1, 3, 5 and 7, the first electrically insulating element 16 is further arranged between at least one of the upper conductive elements 14 and at least one of the lower conductive elements 12 so that said at least one upper conductive element 14 and said at least one lower conductive element 12 separated by the first electrically insulating element 16 are electrically insulated from each other.

A photonic adhesive or a conductive adhesive sensitive to heat, pressure, light, or an electric field, can be used to create the electrical contact between the lower portion 13*a* of one of the active elements 13 and one of the lower conductors 12. In one example, the lower portion 13*a* of the active elements 13 comprises at least one metal fastening element delimiting at least a part capable of being fastened, by the application of a fastening pressure, to the lower conductive elements 12 so as to establish the electrical connection between the lower portion 13*a* of the active element 13 and the lower electrical conductors 12. Examples of metal fasteners are tips, microtubes or even micropillars made of copper. In another example, the lower portion 13*a* of the active elements 13 is electrically connected to the lower conductive elements 12 via an adhesive comprising particles containing silver.

Figure 3:
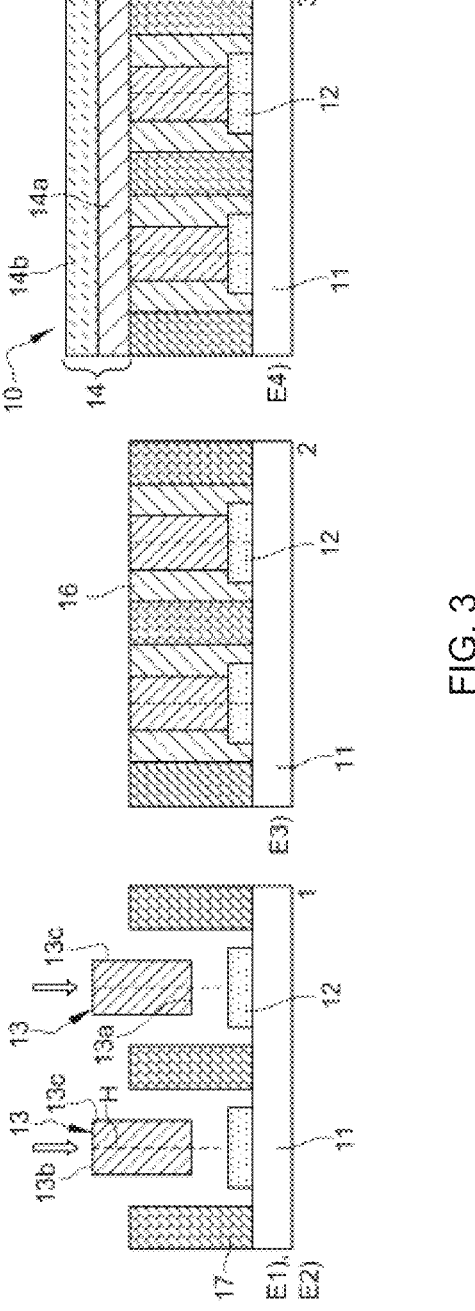
FIG. 3 is a schematic sectional view of several steps of a third example of a manufacturing method of a third embodiment of an electronic device according to the disclosure.
Figure 5:
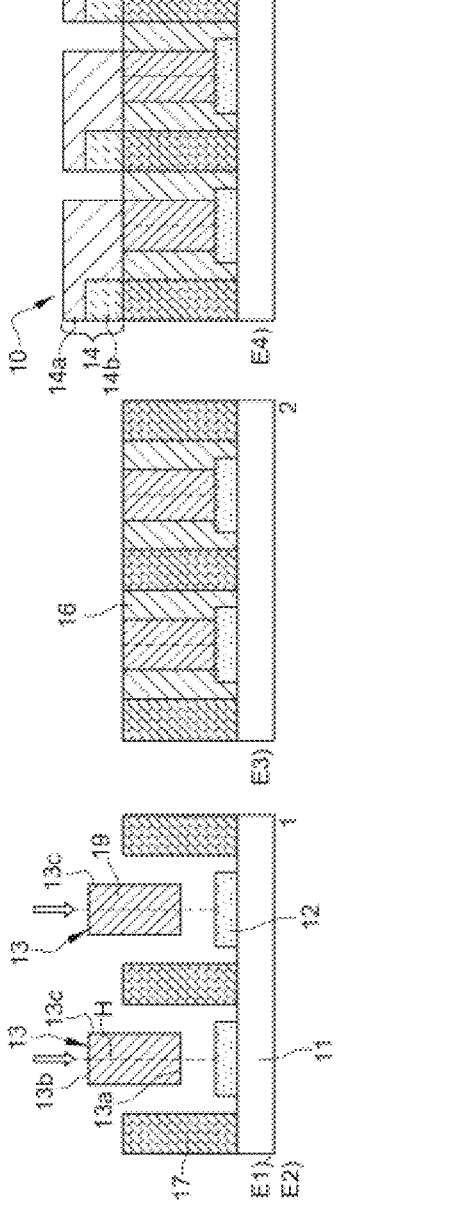
FIG. 5 is a schematic sectional view of several steps of a fifth example of a manufacturing method of a fifth embodiment of an electronic device according to the disclosure.

In an example illustrated in FIGS. 1, 3 and 5, the active elements 13 are connected to the lower conductive elements 12 before the formation of the first electrically insulating element 16.

Figure 2:
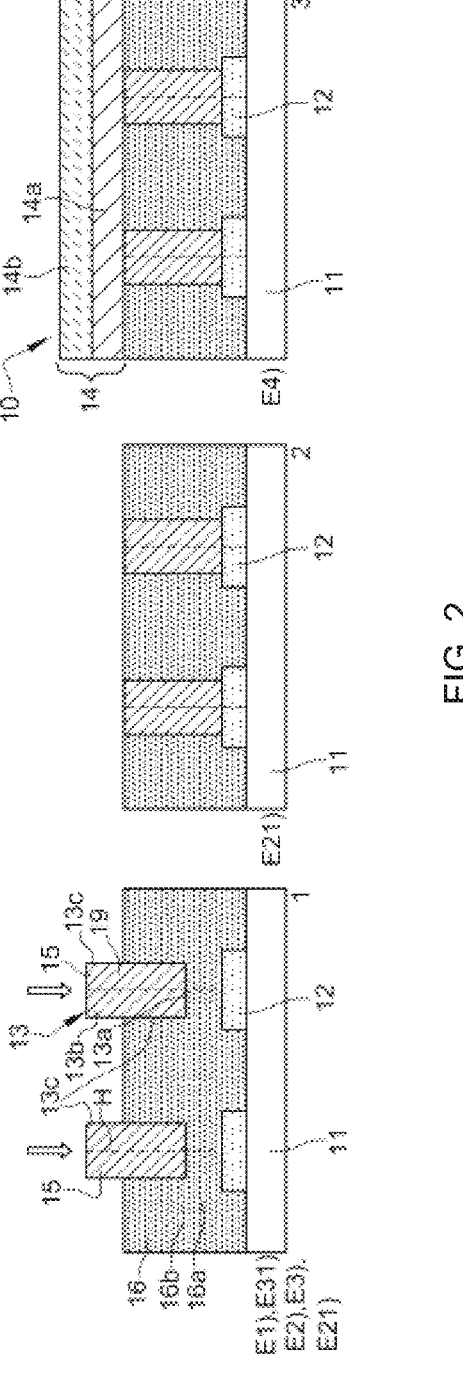
FIG. 2 is a schematic sectional view of several steps of a second example of a manufacturing method of a second embodiment of an electronic device according to the disclosure.
Figure 4:
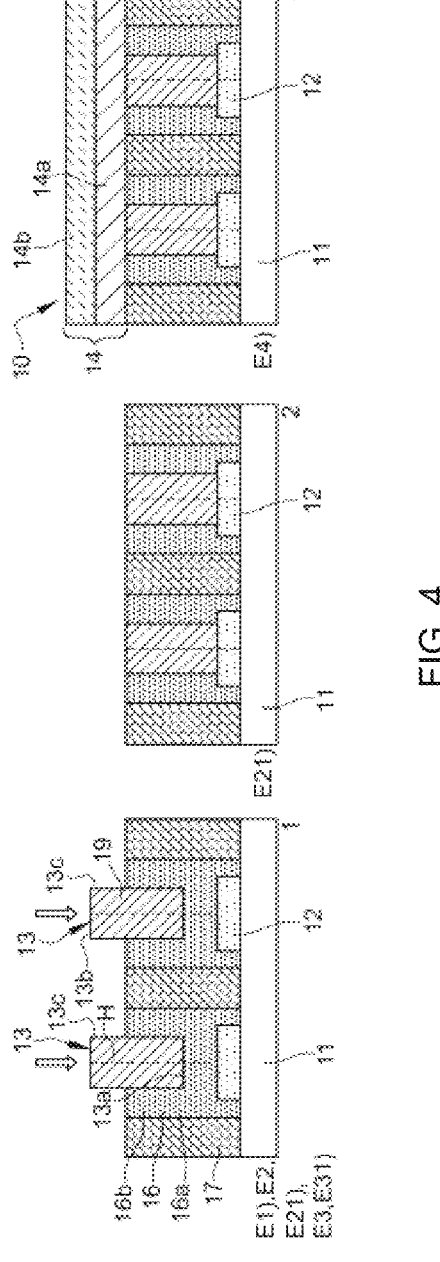
FIG. 4 is a schematic sectional view of several steps of a fourth example of a manufacturing method of a fourth embodiment of an electronic device according to the disclosure.
Figure 6:
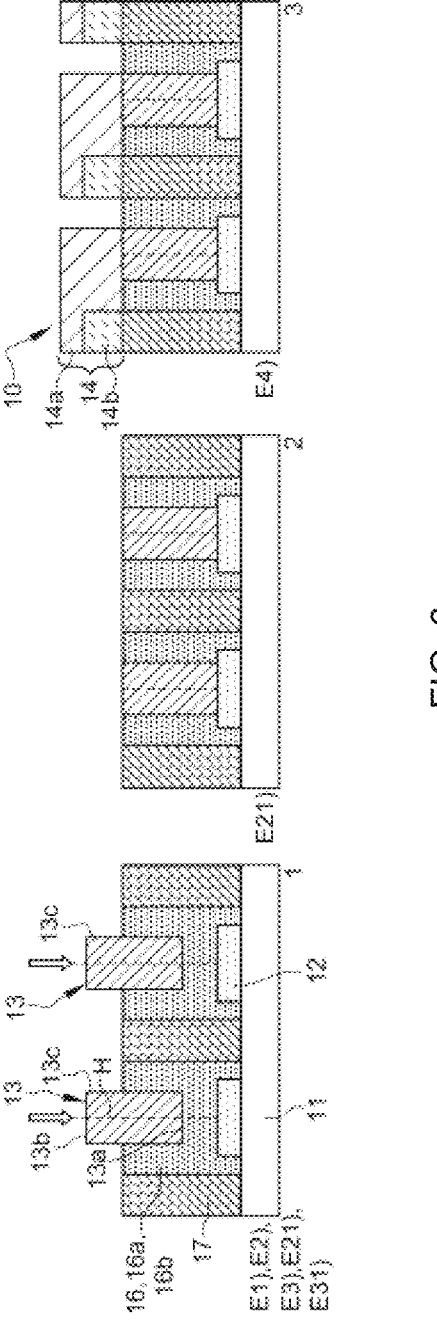
FIG. 6 is a schematic sectional view of several steps of a sixth example of a manufacturing method of a sixth embodiment of an electronic device according to the disclosure.

In an example illustrated in FIGS. 2, 4 and 6, the first electrically insulating element 16 comprises a set of metal particles 16*a*, for example based on silver or even in nickel-gold alloy (Ni—Au), coated in an electrically insulating material 16*b*. This set is adapted so that the first electrically insulating element 16 can vary between a first state of electrical insulation in which the first electrically insulating element 16 does not undergo collapsing pressure and where a majority of the metal particles 16*a* do not touch each other and a second state of anisotropic electrical conductivity in which a majority of the metal particles 16*a* are in electrical contact under the effect of a collapsing pressure applied in the transverse direction. In the second state of anisotropic electrical conductivity, the metal particles 16*a* are grouped together to touch each other and thus form an electrical contact and the remainder of the first electrically insulating element 16 is formed by the electrically insulating material 16*b* thus devoid of the metal particles 16*a*.

In an example illustrated in FIGS. 2, 4 and 6, the first electrically insulating element 16 is also formed in a contact portion arranged between the lower portion 13*a* of at least one of the active elements 13 and at least one of the lower conductive elements 12 connected with the lower portion 13*a* of this active element 13. Thus, the lower portion 13*a* of the active element 13 is brought into electrical contact with the lower conductive element 12 by the passage of the first electrically insulating element 16 from its first state of electrical insulation to its second state of directional electrical conductivity. This is made possible by the application of the collapsing pressure, expressed in the figures by arrows in bold, on the contact portion by the active element 13 and/or the lower support 11. The application of the collapsing pressure results from the action of an electrical bonding device on the active element 13 and/or the lower support 11. Thus, all or part of the metal particles 16*a* of the first electrically insulating element 16, located in the contact portion, provide the electrical connection between the lower portion 13*a* of the active element 13 and the lower conductive element 12. Advantageously, at the same time, the electrically insulating material 16*b* thus dissociated from the metal particles 16*a* surrounds the lateral walls 13*c* of the active element 13 and thus allows the electrical insulation between the lower conductive elements 12 and the upper conductive elements 14, as well as the electrical insulation of the active elements 13 between each other at least laterally.

The electrically insulating material 16*b* can be a resin, an oxide or even a polymer.

In an example illustrated in FIGS. 1 to 6, the electrically insulating element 16, after spin coating or lamination can undergo a chemical-mechanical polishing so that, in the end, the upper portion 13*b* of the active elements 13 is not covered by an insulator and that the recovering of electrical contact of the upper conductive elements 14 is thus facilitated.

According to an embodiment of the electronic device 10, at least one of the active elements 13 includes a control device 19 capable of influencing at least one parameter associated with the active part of this active element 13. The control device 19 can thus comprise at least one transistor of CMOS and/or bipolar and/or thin film transistor (TFT) type technology or any other technology such as Gan (mixture of gallium and nitrogen) or Gan on silicon. It can also include memories or passive components. It is for example powered by a voltage or a current coming from the lower conductive elements 12 and/or the upper conductive elements 14.

According to an embodiment of the electronic device 10, the active part of at least one of the active elements 13 includes a light emission part. The light emission part is configured to be capable of emitting at least one light radiation or electromagnetic radiation when the external parameter applied to the active part is an electric current or a voltage directly or indirectly resulting from at least one among the upper conductive elements 14 and the lower conductive elements 12. Thus, when a control device 19 is provided, it may for example make it possible to modulate at least one emission parameter relating to the light radiation capable of being emitted by the light emission part. For example, an emission parameter can be the light intensity, the light emission angle or the emitted color.

In one example, the control device 19 is sensitive to information optically transmitted. The control device 19 can thus integrate a photodiode making it possible to modulate the light intensity emitted by the active element 13 to which it is linked according to the information received on said integrated photodiode.

In one example, the light emission part of at least one of the active elements 13 includes at least one light-emitting diode. This light-emitting diode may be wire-shaped having micrometric or even nanometric dimensions, and has a main axis of extension overall parallel to the transverse direction mentioned above. The light-emitting diode may also be of the two-dimensional type with a micrometric height. In one example, at least two of the light-emitting diodes of the light emission part of at least one of the active elements 13 are capable of emitting at least two light radiations having different wavelengths. In another example, at least one of the light-emitting diodes of the light emission part of at least one of the active elements 13 is surrounded at least in part by photoluminescent materials capable of transforming the light radiation emitted by the corresponding light-emitting diode.

According to an embodiment of the electronic device 10 illustrated in FIGS. 1 to 7, at least one of the upper conductive elements 14 is formed, on the one hand, by a transparent electrical conductor 14a in direct physical electrical contact, or indirect via conductive elements, with the light emission part of the light active element 13 and, on the other hand, by a metal electrical conductor 14b in electrical contact with the transparent electrical conductor 14a. The transparent electrical conductor 14a advantageously has properties of transparency vis-à-vis the light or electromagnetic radiation that can be emitted by the emission part.

Figure 7:
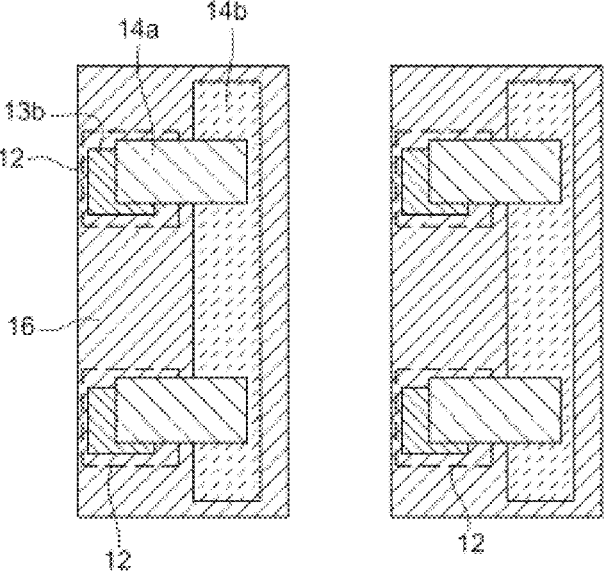
FIG. 7 is a schematic top view of an exemplary electronic device of the disclosure.

In an example illustrated in FIGS. 5, 6 and 7, the metal electrically conductive material 14b of the upper conductive elements 14 is arranged so as not to cover, at least in the transverse direction, the emission part of the active elements 13. A display screen may thus be manufactured with light-emitting diodes associated or not with a control device 19 and formed on an external substrate then transferred and electrically connected with the lower conductive elements 12 and the upper conductive elements 14, the electrical insulation between the different elements being provided by the first electrically insulating element 16.

In another embodiment, the active part of at least one of the active elements 13 comprises a device for measuring said external parameter, configured to change state when said external parameter is applied to said active part. In one example, at least one of the measuring devices is an electrical component selected from a sensor, a transducer, a photodiode, an ultrasonic sensor of the PMUT for "Piezoelectric Micromachined Ultrasonic Transducers" or even CMUT for "Capacitive Micromachined Ultrasonic Transducers" type.

Thus, in an example of this embodiment, the control device 19 may determine the change of state of the measuring device of the active part and delivers an output signal representative of this determination between at least one of the upper conductive elements 14 and one of the lower conductive elements 12. If the external physical quantity, equivalent to the external parameter, is a sound wave or a pressure wave or a pressure, the active element 13 thus configured may capture or measure this external parameter. A voltage and/or a current may thus be generated. An ultrasonic imager may thus be manufactured with transducers and ultrasonic sensors formed on an external substrate then transferred and electrically connected with the lower conductive elements 12 and the upper conductive elements 14, the electrical insulation between the different elements being provided by the first electrically insulating element 16.

In another embodiment of the electronic device 10 illustrated in FIGS. 3, 4, 5 and 6, a second electrically insulating element 17, distinct from the first electrically insulating element 16, is arranged between at least two adjacent active elements 13 disposed side by side on the support surface of the lower support 11 and between the upper conductive elements 14 and the lower conductive elements 12 so as to electrically insulate the adjacent active elements 13 from each other, which are separated from each other by the second electrically insulating element 17 and/or the upper conductive elements 14 and the lower conductive elements 12 separated from each other by the second electrically insulating element 17.

In an example illustrated in FIGS. 5 and 6, the metal electrical conductor 14b of at least one of the upper conductive elements 14 is arranged between the second electrically insulating element 17 and the transparent electrical conductor 14a.

In one example, at least one of the upper conductive elements 14 delimits a local portion arranged at the level of the upper portion 13b of the active element 13 to which it is connected, said local portion of the upper electrical element 14 being formed at least in part by adaptive lithography.

An advantage of such electronic devices 10 is that the lower and upper electrical contacts are electrically insolated in a robust and economical manner, even if the topography, equivalent to the height H of the active elements 13, is in the range of about ten micrometers.

An advantage of such electronic devices 10 also comes from the fact that it is possible to power the lower and upper electrical contacts on different topographic levels, which limits short circuits.

Another advantage of such electronic devices 10 is that its implementation may be carried out with techniques which do not require high temperature and pressure. These techniques are also suitable for applications on large surfaces, for example greater than that of a commercial silicon disc. This is advantageous for making large-scale light display devices or physical quantity capture devices involving many sensors, such as ultrasound imaging devices using ultrasound scan.

An additional advantage of such electronic devices 10 is that the recovery of electrical contact with the upper electrical contacts is facilitated.

Another advantage of such electronic devices 10 is that the electrical efficiency of the contact recovery at the upper level is improved because voltage losses are reduced.

The disclosure also relates to a method for manufacturing an electronic device 10 for capturing or emitting a physical quantity.

The method is illustrated in FIGS. 1 to 6 and comprises the following steps:

E1) provide a lower support 11 comprising lower conductive elements 12 electrically insulated from each other and formed at least in part on a support surface of the lower support 11;

E2) provide a plurality of active elements 13 having a thickness H considered in a transverse direction oriented transversely to the lower support 11 and each including a lower portion 13a capable of being electrically connected to at least one of the lower conductive elements 12, an upper portion 13b disposed on the side opposite to the lower support 11 relative to the lower portion 13a in the transverse direction and an active part capable of changing state when an external parameter external to the active part is applied to the active part, each active element 13 provided in step E2) delimiting externally, along the thickness H, at least one lateral wall 13c which extends laterally around at least the lower portion 13a and the upper portion 13b;

E3) form at least one first electrically insulating element 16 arranged between at least a part of said at least one lateral wall 13c of at least two adjacent active elements 13 disposed side by side on the support surface of the lower support 11 so as to electrically insulate the lateral walls 13c from each other, which are separated by the first electrically insulating element 16;

E4) form upper conductive elements 14 electrically insulated from each other so that the upper portion 13b of each active element 13 is electrically connected to at least one of the formed upper conductive elements 14.

In this manufacturing method, at the end of one of steps E2) and E3), the lower portion 13a of at least one of the active elements 13 is electrically connected to at least one of the lower conductive elements 12. Thus, in a case illustrated in FIG. 1, the active elements 13 are formed and connected to the lower conductive elements 12 before that all or part of the lateral walls 13c of the active elements 13 become surrounded by the first electrically insulating element 16. In another case, illustrated in FIG. 2, the first electrically insulating element 16 is first deposited in particular on the lower conductive elements 12. Then the active elements 13 are formed and are connected to the lower conductive elements 12 for example through the first electrically insulating element 16 as explained below or via a recess of the first insulating element 16 prior to the connection of the active elements 13 to the lower conductive elements.

In this manufacturing method, at the end of step E4), the first electrically insulating element 16 is further arranged between at least one of the upper conductive elements 14 and at least one of the lower conductive elements 12 so that said at least one upper conductive element 14 and said at least one lower conductive element 12 separated by the first electrically insulating element 16 are electrically insulated from each other. This makes it possible to limit short circuits between the different levels of conductive elements for example during the formation of electrically conductive elements 14.

In a particular non-limiting implementation of the manufacturing method, a planarization step can be carried out after step E3) in order to improve the contact at the level of the upper portion 13b of the active elements 13. The planarization step may for example be carried out by the action of a chemical-mechanical polishing device or even with a reactive ion-based dry etching.

According to another particular non-limiting implementation, the active elements 13 provided in step E2) are obtained on an external support different from the lower support 11 prior to a transfer, implemented during step E2), of said active elements 13 towards the lower support 11. This makes it possible to form the active elements 13 on an external substrate, less fragile and withstanding high temperatures for example, and then to transfer them to the lower support. This lower support 11 would for example not withstand high temperatures or would be too wide to be compatible with the substrates allowing the formation of the active elements 13.

According to a particular non-limiting implementation illustrated in FIGS. 2, 4 and 6, the first electrically insulating element 16 formed in step E3) comprises a set of metal particles 16a coated in an electrically insulating material 16b adapted so that the first electrically insulating element 16 is capable of varying between:

a first state of electrical insulation in which the first electrically insulating element 16 does not undergo collapsing pressure and where a majority of the metal particles 16a do not touch each other, and a second state of directional electrical conductivity in which a majority of the metal particles 16a are in electrical contact under the effect of a collapsing pressure.

The step E3) then comprises a step E31) consisting in forming the first electrically insulating element 16 in a contact portion arranged between the lower portion 13a of at least one of the active elements 13 and at least one of the lower conductive elements 12 capable of being connected with the lower portion 13a of this active element 13. Step E2) then also comprises a step E21) consisting in applying the collapsing pressure on the contact portion by a relative movement of the active element 13 and the lower support 11.

The relative movement results from the action of an electrical bonding device on at least one element taken from the group comprising the active element 13 and the lower support 11, so that all or part of the metal particles 16a of the first electrically insulating element 16, located in the contact portion, are in their second state of directional electrical conductivity thus ensuring the electrical connection between the lower portion 13a of the active element 13 and the lower conductive element 12.

An advantage of this method is that the contact is formed only under the active element 13. This prevents parasitic welds from contacting the lateral walls of the active elements 13 and creating short circuits.

An advantage of this manufacturing method lies in that its implementation can be carried out with techniques which do not require high temperature and pressure. These techniques are also suitable for applications on large surfaces, which is advantageous for producing light display devices or imaging devices of large dimensions, for example of a dimension greater than that of a commercial silicon disc.

The invention claimed is:

1. An electronic device for capturing or emitting a physical quantity, the electronic device comprising:

a lower support;

lower conductive elements electrically insulated from each other and formed at least in part on a support surface of the lower support;

a plurality of active elements having a thickness (H) considered in a transverse direction oriented transversely to the lower support and each including a lower portion electrically connected to at least one of the lower conductive elements and an upper portion disposed on the side opposite to the lower support relative to the lower portion in the transverse direction, each active element including an active part capable of changing state when an external parameter external to said active part is applied to said active part; and upper conductive elements electrically insulated from each other;

wherein the upper portion of each active element is electrically connected to at least one of the upper conductive elements and each active element delimits externally, along the thickness (H), at least one lateral wall which extends laterally around the active element;

wherein at least one first electrically insulating element is arranged between at least a part of said at least one lateral wall of at least two adjacent active elements disposed side by side on the support surface of the lower support so as to electrically insulate the lateral walls from each other, which are separated by the first electrically insulating element; and wherein the first electrically insulating element is arranged between at least one of the upper conductive elements and at least one of the lower conductive elements so that said at least one upper conductive element and said at least one lower conductive element separated by the first electrically insulating element are electrically insulated from each other.

2. The electronic device according to claim 1, wherein at least one of the active elements includes a control device capable of influencing on at least one parameter associated with the active part of said active element.

3. The electronic device according to claim 1, wherein the active part of at least one of the active elements includes a light emission part capable of emitting at least one light radiation when the external parameter applied to the active part is an electrical quantity resulting from at least one among the upper conductive elements and the lower conductive elements.

4. The electronic device according to claim 2, wherein the control device is capable of modulating at least one emission parameter relating to the light radiation configured to be emitted by the light emission part.

5. The electronic device according to claim 4, wherein the control device comprises at least one transistor.

6. The electronic device according to claim 3, wherein at least one of the upper conductive elements is formed by a transparent electrical conductor in electrical contact with the light emission part of the active element and having properties of transparency related to the light radiation configured to be emitted by the emission part and by a metal electrical conductor in electrical contact with the transparent electrical conductor.

7. The electronic device according to claim 6, wherein the metal electrical conductor of the upper conductive elements is arranged so as not to cover, at least in the transverse direction, the emission part of the active elements.

8. The electronic device according to claim 3, wherein the light emission part of at least one of the active elements includes at least one light-emitting diode.

9. The electronic device according to claim 8, wherein said light-emitting diode is wire-shaped having micrometric dimensions and whose main axis of extension is overall parallel to the transverse direction.

10. The electronic device according to claim 8, wherein at least two of the light-emitting diodes of the light emission part of at least one of the active elements are capable of emitting at least two light radiations having different wavelengths.

11. The electronic device according to claim 8, wherein at least one of the light-emitting diodes of the light emission part of at least one of the active elements is surrounded at least in part by photoluminescent materials capable of transforming the light radiation emitted by the corresponding light-emitting diode.

12. The electronic device according to claim 1, wherein the active part of at least one of the active elements comprises a device for measuring said external parameter configured to change state when said external parameter is applied to said active part.

13. The electronic device according to claim 12, wherein at least one of the active elements includes a control device capable of influencing on at least one parameter associated with the active part of said active element, and wherein the control device determines the change of state of the measuring device of the active part and delivers an output signal representative of this determination between at least one of the upper conductive elements and one of the lower conductive elements.

14. The electronic device according to claim 12, wherein at least one of the measuring devices is an electrical component selected from a sensor and a transducer.

15. The electronic device according to claim 1, wherein the active elements are obtained on an external support distinct from the lower support prior to a transfer of said active elements towards said lower support.

16. The electronic device according to claim 1, wherein the first electrically insulating element comprises a set of metal particles coated in an electrically insulating material adapted so that the first electrically insulating element is capable of varying between a first state of electrical insulation in which the first electrically insulating element does not undergo collapsing pressure and where a majority of the metal particles do not touch each other and a second state of anisotropic electrical conductivity in which a majority of the metal particles are in electrical contact under the effect of a collapsing pressure applied in the transverse direction.

17. The electronic device according to claim 16, wherein the first electrically insulating element is arranged in a contact portion arranged between the lower portion of at least one of the active elements and at least one of the lower conductive elements connected with the lower portion of this active element;

the lower portion of the active element being brought into electrical contact with the lower conductive element by the passage of the first electrically insulating element from a first state of electrical insulation to a second state of directional electrical conductivity by the application of the collapsing pressure on the contact portion by the active element and/or the lower support, resulting from the action of an electrical bonding device on at least one element taken from the group comprising the active element and the lower support, so that all or part of the metal particles of the first electrically insulating element, located in the contact portion, provide the electrical connection between the lower portion of the active element and the lower conductive element.

18. The electronic device according to claim 1, wherein a second electrically insulating element, distinct from the first electrically insulating element, is arranged between at least two adjacent active elements disposed side by side on the support surface of the lower support and between the upper conductive elements and the lower conductive elements so as to electrically insulate from each other the members of at least one of the following two groups:

a first group consisting of the adjacent active elements separated from each other by the second electrically insulating element; and a second group consisting of the upper conductive elements and the lower conductive elements separated from each other by the second electrically insulating element.

19. The electronic device according to claim 18, wherein the metal electrical conductor of at least one of the upper conductive elements is arranged between the second electrically insulating element and the transparent electrical conductor.

20. The electronic device according to claim 1, wherein at least one of the upper conductive elements delimits a local portion arranged at the level of the upper portion of the active element to which the local portion of the upper conductive element is connected, said local portion of the upper electrical element being formed at least in part by adaptive lithography.

21. The electronic device according to claim 1, wherein the external parameter is comprised in the group formed by a sound wave, a light radiation, an electromagnetic radiation, an electric current, a potential difference, and a pressure wave.

22. A method for manufacturing an electronic device for capturing or emitting a physical quantity, the method including the following steps:

E1) providing a lower support comprising lower conductive elements electrically insulated from each other and formed at least in part on a support surface of the lower support;

E2) providing a plurality of active elements having a thickness (H) considered in a transverse direction oriented transversely to the lower support and each including a lower portion capable of being electrically connected to at least one of the lower conductive elements, an upper portion disposed on the side opposite to the lower support (11) relative to the lower portion in the transverse direction and an active part capable of changing state when an external parameter external to said active part is applied to said active part, each active element provided in step E2) delimiting externally, along the thickness (H), at least one lateral wall which extends laterally around at least the lower portion and the upper portion;

E3) forming at least one first electrically insulating element arranged between at least a part of said at least one lateral wall of at least two adjacent active elements disposed side by side on the support surface of the lower support so as to electrically insulate the lateral walls from each other, which are separated by the first electrically insulating element;

manufacturing method in which at the end of one of the steps E2) and E3), the lower portion of at least one of the active elements is electrically connected to at least one of the lower conductive elements; and E4) forming upper conductive elements electrically insulated from each other so that the upper portion of each active element is electrically connected to at least one of the formed upper conductive elements;

manufacturing method in which at the end of step E4), the first electrically insulating element is further arranged between at least one of the upper conductive elements and at least one of the lower conductive elements so that said at least one upper conductive element and said at least one lower conductive element separated by the first electrically insulating element are electrically insulated from each other.

23. The manufacturing method according to claim 22, wherein the active elements provided in step E2) are obtained on an external support different from the lower support prior to a transfer, implemented during step E2), of said active elements towards the lower support.

24. The manufacturing method according to claim 23, wherein the first electrically insulating element comprises a set of metal particles coated in an electrically insulating material adapted so that the first electrically insulating element is capable of varying between a first state of electrical insulation in which the first electrically insulating element does not undergo a collapsing pressure and where a majority of the metal particles do not touch each other and a second state of directional electrical conductivity in which a majority of the metal particles are in electrical contact under the effect of a collapsing pressure the step E3) comprising a sub-step E31) including forming the first electrically insulating element in a contact portion arranged between the lower portion of at least one of the active elements and at least one of the lower conductive elements capable of being connected with the lower portion of this active element;

the method further including a step E21) including applying the collapsing pressure on the contact portion by a relative movement between the active element and the lower support, the relative movement resulting from the action of an electrical bonding device on at least one element taken from the group comprising the active element and the lower support, so that all or part of the metal particles of the first electrically insulating element, located in the contact portion, are in their second state of directional electrical conductivity providing the electrical connection between the lower portion of the active element and the lower conductive element.

* * * * *